United States Patent [19]
Sayka

[11] Patent Number: 5,631,799
[45] Date of Patent: *May 20, 1997

[54] FUSION HEAT SINK FOR INTEGRATED CIRCUIT

[75] Inventor: Anthony Sayka, San Antonio, Tex.

[73] Assignee: VLSI Technology, Inc., San Jose, Calif.

[ * ] Notice: The term of this patent shall not extend beyond the expiration date of Pat. No. 5,477,409.

[21] Appl. No.: 535,538

[22] Filed: Sep. 28, 1995

Related U.S. Application Data

[63] Continuation of Ser. No. 158,124, Nov. 24, 1993, Pat. No. 5,477,409.

[51] Int. Cl.$^6$ ..................................... H02H 5/04
[52] U.S. Cl. ..................... 361/103; 361/104; 361/699; 361/704
[58] Field of Search ..................... 361/24, 31, 104, 361/37, 103, 704, 688, 699, 708; 364/707; 439/196

[56] References Cited

U.S. PATENT DOCUMENTS

| | | | |
|---|---|---|---|
| 4,057,101 | 11/1977 | Ruba et al. | 361/708 |
| 5,455,458 | 10/1995 | Quon et al. | 361/708 |

*Primary Examiner*—Todd DeBoer
*Attorney, Agent, or Firm*—Clifton L. Anderson

[57] ABSTRACT

An integrated circuit system includes an integrated circuit with a heat sink assembly including a fusible core. In the event that power dissipation by the integrated circuit threatens to exceed its safe operating range, the fusible core melts, absorbing the heat of fusion and delaying further temperature increases. A motor is repeatedly activated to attempt to rotate a shaft within the fusible core. When the core is solid, the shaft cannot be turned, but once it melts the shaft turns. The shafts motion is detected and used to trigger a reduction in the drive clock frequency of the integrated circuit. This reduces power consumption and dissipation until the integrated circuit cools and the heat sink core solidifies.

9 Claims, 5 Drawing Sheets

FUSION HEAT SINK FOR INTEGRATED CIRCUIT

This application is a continuation of Ser. No. 158,124, U.S. Pat. No. 5,477,409, filed Nov. 24, 1993.

BACKGROUND OF THE INVENTION

The present invention relates to integrated circuits and, more particularly, to thermal protection systems for integrated circuits. A major objective of the present invention is to provide for thermal protection of an integrated circuit.

Much of modern progress has been based on integrated circuits of increasing speed and integration. Along with increased speed and integration has come increased power consumption, as well as increased heat dissipation. Additionally, some applications require high-power devices that can generate considerable heat despite a low level of integration. Ideally, the dissipated heat is removed as fast as it is generated. When heat is generated faster than it is dissipated, the temperature of the integrated circuit rises. In extreme cases, the heat can damage the integrated circuit and/or surrounding components.

The problem with handling dissipated heat is handled in part by designing circuits that generate relatively little heat for their given level of functionality. The increasing implementation of CMOS technology in very-large-scale-integration devices is due in part to its lower power requirements, and thus low heat generation. Even using such power-conserving technology, modern microprocessors consume over ten Watts. Removing the heat dissipated by such circuits can be problematic, especially where the integrated circuits are closely arranged in an enclosure with limited ventilation.

To assist heat removal, heat sinks have been attached to integrated circuits. Heat sinks are typically metal for good thermal conductivity. The heat sinks tend to have fins or other features that provide a relatively large surface area from which heat transferred from the integrated circuit can be radiated into the ambient air.

Heat sinks are considered passive cooling systems in that they require no power or control to function. Passive cooling systems are preferred for their simplicity, economy, and reliability. However, active cooling systems can be required where heat removal requirements are high. For examples, electric fans can be built into a heat sink. Other systems provide for circulating coolant. Water and even liquid helium or nitrogen cooling systems can also be used. Heat pipes are in development for integrated circuits that absorb the heat of vaporization by boiling a liquid, and then remove the vapor. However, all these active and circulating systems suffer cost, complexity, and reliability concerns.

Thermal protection circuitry can be used to protect circuit components when heat removal is inadequate. A heat sensor can trigger when local heat is excessive. The sensor can be coupled to a switch that turns off the power to the system incorporating the overheating device. However, even with the power shut off, accumulated heat can continue to affect system components adversely. This problem can be mitigated by setting the sensor trigger threshold at a level that is safe for continuous operation. However, this can cause the system to shut down more frequently than necessary.

What is needed is improved protection of integrated circuits from accumulated heat. Both improved heat sinking and thermal protection circuitry are desired.

SUMMARY OF THE INVENTION

The present invention provides a heat sink using the heat of fusion to assist heat removal. Accordingly, a heat sink can incorporate a meltable material that has a melting point within the temperature operating range of an integrated circuit. The heat sink is physically and thermally coupled to the integrated circuit. When the heat accumulated in the heat sink reaches the melting point of the material, the heat required to melt to the material is effectively removed from the accumulated heat.

While the present invention provides for one time operation, it is desirable that the heat sink be able to reset itself. Accordingly, the meltable material can be confined by a container that has a higher melting point than the meltable material. When the integrated circuit cools and the material freezes, the material is restored to the form and the position it had before melting. The heat sink is then prepared for a new operating cycle.

The invention further provides that the melting can trigger an event that reduces power consumption by the offending integrated circuit. The most simple event is a power off condition. The delay in temperature rise due to the heat required for melting permits a controlled shutdown, allowing data and state information to be saved. A desirable alternative is to allow continued operation at reduced power consumption. For example, the frequency of a clock signal can be reduced to lower power consumption. In other cases, certain optional components can be disabled. For example, the floating point section of a microprocessor can be disabled until it cools. In other cases, the melting can increase heat removal by triggering other cooling mechanisms, such as a fan.

The power reduction can be reversed in an appropriate manner. A manual restart can reset the initial power on condition. Alternatively, the resolidification (freezing) of the meltable material can trigger a resumption of activity, a increase in clock speed, or reenablement of disabled components. When the integrated circuit cools and the material resolidification, the clock speed can be increased, components reenabled, fans turned off, etc.

Several methods are available by which melting can trigger reduced power consumption or increased cooling. The meltable material can serve as or in a circuit element the output of which changes with the phase of the material. For example, the meltable material can be a conductor; when the material melts, a circuit path is broken. The breaking of the circuit can trigger the power shutdown, clock reduction, etc. In this facet, the meltable material functions much like a fuse. The circuit can take advantage of the volume change on melting to effect a circuit break; when the material freezes the circuit is restored and full power operation can resume. (Alternatively, melting can make a circuit and freezing can break the circuit). Also, the volume change can be detected optically, the optical detection being used to trigger the power handling.

A more refined implementation employs a motor and motion detection to determine whether a drive element is frozen or not in the meltable material. A motor can, either intermittently or continuous, try to drive a shaft immersed in the meltable material. When the material is solid, the shaft does not turn. When the material is liquid, the shaft turns. This turning is detected, and the detection is used to trigger the power-reducing event.

The heat sink would preferably employ standard features of passive heat sinks. These include use of material with high thermal conductivity to remove heat quickly from the integrated circuit and a high surface area to volume ratio to maximize radiation of heat into the surrounding air. The bulk material of the heat sink can, for example, be aluminum. The meltable material can be gallium or a gallium alloy. Where the meltable material is incorporated in a trigger circuit, it can be electrically insulated from the bulk of the heat sink by an insulator with high thermal conductivity such as barium nitride.

The present invention provides for heat sinks to be dedicated to a specific integrated circuit. As an alternative, a printed circuit board can have meltable heat sinks built in at the locations to be occupied by high-power integrated circuits. In such cases, it can be convenient for the heat sinks to be coupled to a switch on the printed circuit that controls power to the integrated circuits.

The present invention provides for enhanced heat removal at a selected temperature. The temperature can be selected to maximize the operating range of the system while providing enhanced cooling at a critical temperature. The temperature can be selected, for example, by selecting an appropriate fusible alloy or a low-temperature solder.

When used to trigger a heat-handling event, the present invention has a considerable advantage over other temperature-based triggering systems that do not in and of themselves remove heat. The melting removes heat immediately, while other systems must wait for the effects of the triggered event to have its impact. The invention provides for continuous operation through overheating, and resumption of full power operation once the heating problem is mitigated. An important feature of the present invention is that it can be used in conjunction with other available heat-sink approaches. These and other features and advantages of the present invention are apparent from the description below with reference to the following drawings.

DESCRIPTION OF THE PREFERRED EMBODIMENTS

Figure 1:
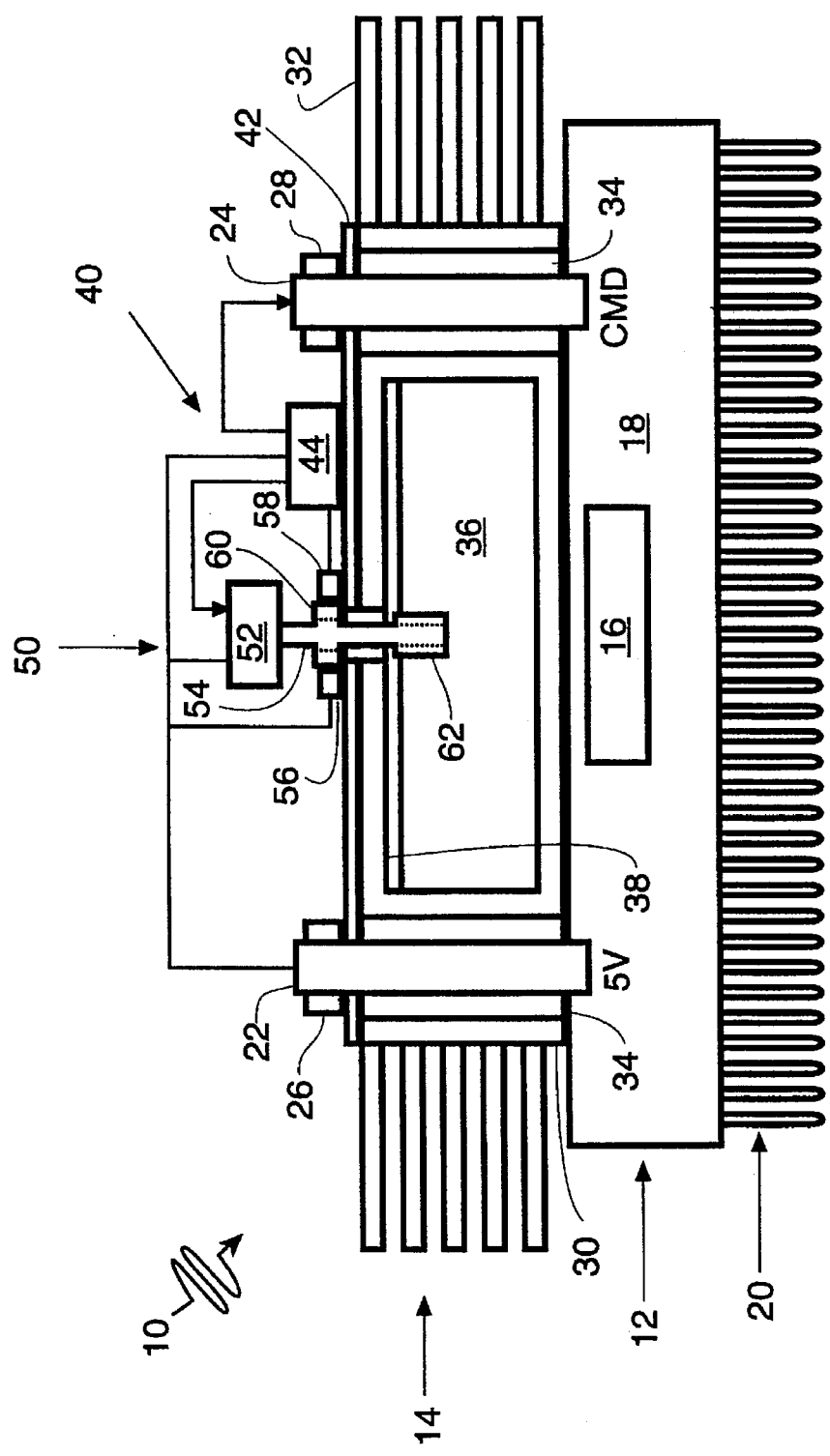
FIG. 1 is a schematic sectional view integrated circuit system with heat sink in accordance with the present invention.

An integrated circuit system 10 comprises an integrated circuit package 12 and a heat sink assembly 14. Integrated circuit package 12 includes an integrated circuit 16, a ceramic housing 18, a multitude of upward extending pins 20, and studs 22 and 24. Integrated circuit 12 provides the data processing functionality of integrated circuit system 10. Pins 20 provide for communications between integrated circuit 16 and a host system. Housing 18 protects integrated circuit 16 and provides interfacing between integrated circuit 16 and pins 20. Studs 22 and 24 provide mechanical interfacing with heat sink assembly 14 in conjunction with nuts 26 and 28. In addition, studs 22 and 24 provide for thermal and electrical interfacing with heat sink assembly 14.

Heat sink 14 includes an aluminum body 30, aluminum fins 32, barium nitride stud insulators 34, a fusible core 36 in a cavity 38 of body 30, and a control assembly 40. Control assembly 40 includes a printed circuit board 42, a control circuit 44, and a phase-detector 50. Detector 50 includes a motor 52, a ceramic shaft 54, and brushes 56 and 58. Ceramic shaft 54 has a rotatable conductive contact 60 which alternately makes and breaks a connection between brushes 56 and 58.

Mechanical interfacing is provided by studs 22 and 24 which are permanently installed in ceramic housing 18. Heat sink assembly 14 is mounted on integrated circuit package 12 so that stud insulators 34 slide down over studs 22 and 24. Nuts 26 and 26 then bolt heat sink assembly 14 to integrated circuit package 12.

Thermal interfacing is provided by the large contact area between heat sink body 30 and ceramic housing 18. This thermal interfacing can be enhanced by metal thermal vias that extend from near integrated circuit 16, through ceramic housing 18 to contact heat sink body 30. Studs 22 and 24 also provide for thermal interfacing. In addition, barium nitride is an effective thermal conductor. All this thermal interfacing provides for heat removal from integrated circuit 16.

Heat removal from integrated circuit 16 is initially by thermal conduction to the surrounding ceramic housing. A substantial portion of this heat is transferred by conduction to heat sink assembly 14. The heat received by heat sink assembly 14 is distributed therethrough by conduction, e.g., through aluminum body 30, to fins 32, and core 36. Exposed surfaces of body 30 and fins 32 radiate heat to ambient air.

As long as the heat conducted from integrated circuit 16 exceeds the heat radiated, the temperature of heat sink assembly increases. Preferably, the incorporating system is designed so that the radiated heat is carried away by convection. The rate at which heat is radiated by heat sink assembly 14 is correlated with the heat differential between heat sink assembly 14 and the ambient air. Generally, the hotter heat sink assembly 14 becomes, the faster heat is radiated. Therefore, the temperature of heat sink assembly 14 typically levels off at a temperature correlated with the power dissipated by integrated circuit 16.

The temperature of integrated circuit 16 is typically significantly higher than that of heat sink assembly 14 since 1) integrated circuit 16 is the heat source, 2) not all heat from integrated circuit 16 is conducted to heat sink assembly 14, and 3) heat sink assembly 14 more effectively radiates accumulated heat. The material of fusible core 36 is selected to melt at a local temperature that would be expected to occur when integrated circuit 16 is near the high end of its thermal operating range. Thus, when integrated circuit 16 approaches its thermal limits, fusible core 36 melts. Heat is absorbed in the process of fusion. This delays the temperature rise. Where high-dissipation conditions are momentary, the delay can be the difference between overheating and not overheating. Thus, the fusible core by itself provides a margin of safety for integrated circuit 16.

Heat sink assembly 14 is designed to manage more enduring thermal excursions. To this end, control circuit 44 periodically commands motor 52 to turn shaft 54. The bottom 62 of shaft 54 is rectangular. When fusible core 36 is in its solid phase, shaft 54 does not turn. Depending on the orientation of shaft 54, conductive contact 60 either is or is not in contact with both brushes 56 and 58. In either case, the status of conductive contact 60 does not change when core 36 is solid. No action is taken if the status of conductive contact 60 is not changing.

When core 36 is in its liquid phase, shaft 54 turns in response to activation of motor 52 by control circuit 44. As shaft 54 turns, conduction contacts 60 alternately couple and decouple brushes 56 and 58. Brush 56 is coupled to power (5 Volts); brush 58 is tied to ground through a resistance. When coupled, brush 58 is at a high voltage, when uncoupled, brush 58 is at ground. Control circuit 44 is coupled to brush 58 to detect the voltage thereat. When control circuit 44 detects two voltage highs with an intermediate voltage low within one minute, it acts to reduce power dissipation by integrated circuit 16. Specifically, in response to an indication that core 36 is in its liquid phase, control circuit 44 issues a command that causes the drive clock frequency of integrated circuit 16 to drop by half. The lower rate of operation reduces power consumption. Usually, this will address the threat of overheating. Control circuit 44 continues to interrogate core 36 by activating motor 52 periodically. The clock rate is held low until the result of the interrogation is an indication that core 36 is solid. In that case, control circuit 44 issues a command to return the drive clock to its higher frequency.

The temperature at which power reduction is initiated is determined by selection of the material for fusible core 36. Integrated circuit 16 has a safe operating range of 0°–70° C. Fusible core 36 is an alloy of 66% indium and 24% bismuth; this alloy has a melting point of 67° C. The melting point is selected to be slightly below the maximum operating temperature to allow for the thermal gradient between circuit and core.

Figure 2:
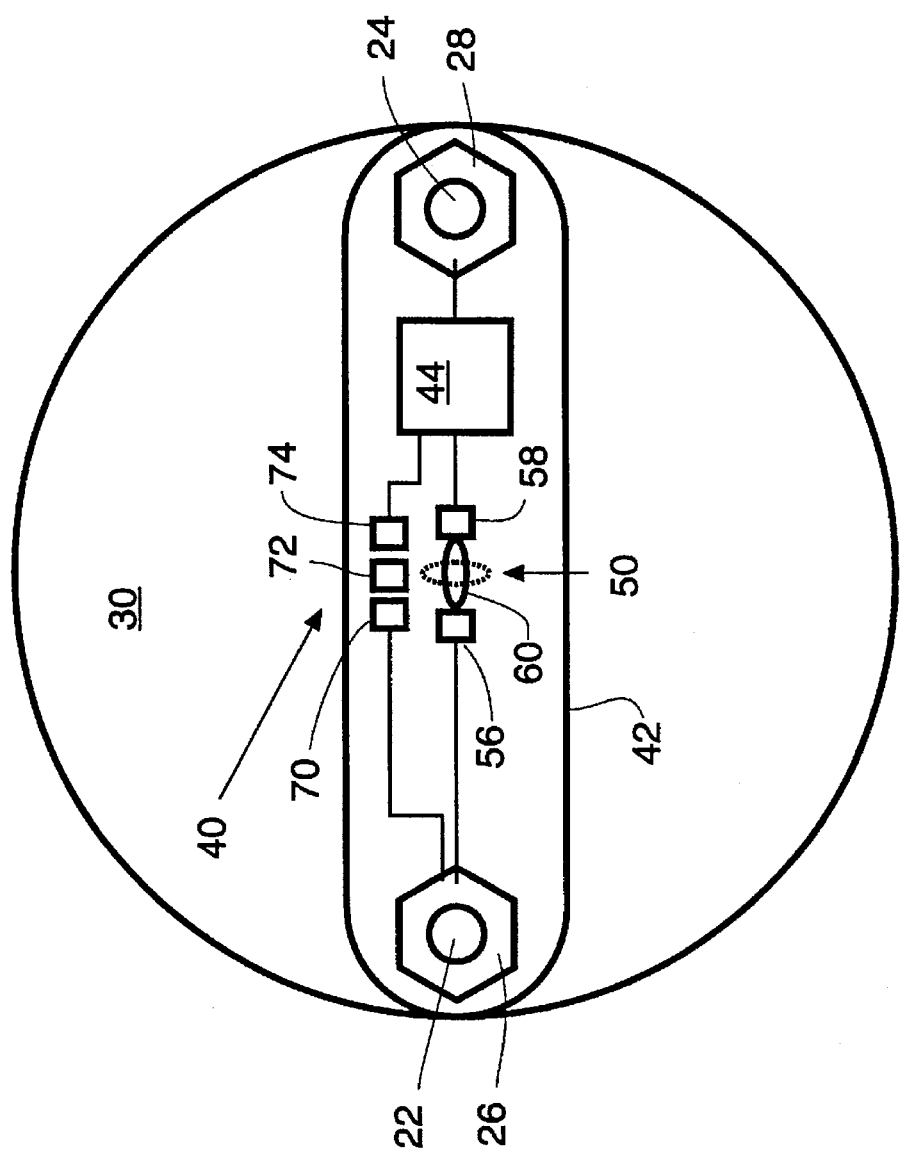
FIG. 2 is a schematic plan view of the system FIG. 1. Heat sink fins and a motor are not shown in FIG. 2.

In integrated circuit system 10, studs 22 and 24 serve as electrical connections between printed circuit board 42 and integrated circuit package 12. Stud 22 is coupled to a 5 Volt power supply; stud 24 is coupled to a clock doubling enable/disable input of integrated circuit 16. As indicated in FIG. 2, power is coupled through stud 22 and nut 26 to 1) control circuit 44, brush 56, and to a contact 70 for motor 52. Control circuit 44 is coupled to nut 28 and to stud 24 to provide clock rate commands to integrated circuit 16. Control circuit 44 is coupled to a contact 72 to provide control signals to activate motor 52. Control circuit 44 is coupled to brush 58 for detecting the voltage thereat. Brush 58 is also coupled through a resistance in printed circuit board 42 to aluminum heat sink body 30, which is held at ground. (The connection through integrated circuit package 12 is not illustrated.) A ground contact 74 for motor 52 is also connected by a via through printed circuit board 42 to heat sink body 30.

In FIG. 2, conductive contact 60 is shown to be oval in cross section. As illustrated with a solid line, contact 60 has the status of making contact between brushes 56 and 58. As illustrated with a dotted line, contact 60 has the status of leaving brushes 56 and 58 uncoupled. As an alternative to integrated circuit system 10, an integrated circuit can be packaged so that the meltable material is in direct contact with the integrated circuit for better thermal coupling.

Figure 3:
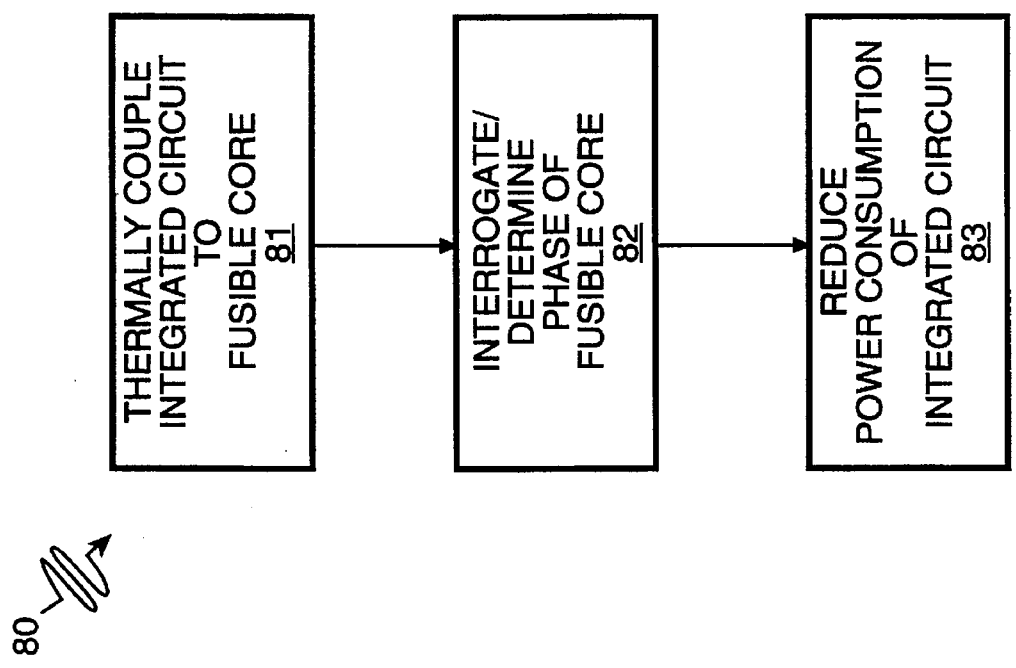
FIG. 3 is a flow chart of a method in accordance with the present invention practiced with the system of FIG. 1.

A method 80 employed by integrated circuit system 10 is illustrated in FIG. 3. At a step 81, an integrated circuit is thermally coupled to a fusible core that melts at a temperature within the operating range of the integrated circuit. At step 82, the core is interrogated to determine its phase. At step 83, the power consumption of the integrated circuit is reduced if the result of step 82 is that the phase of the core is liquid. Step 83 can involve shutting off power to the integrated circuit, or changing its operation to a lower power mode. Preferably, the core is confined so that it can be restored to its original position and form upon resolidification.

Figure 4:
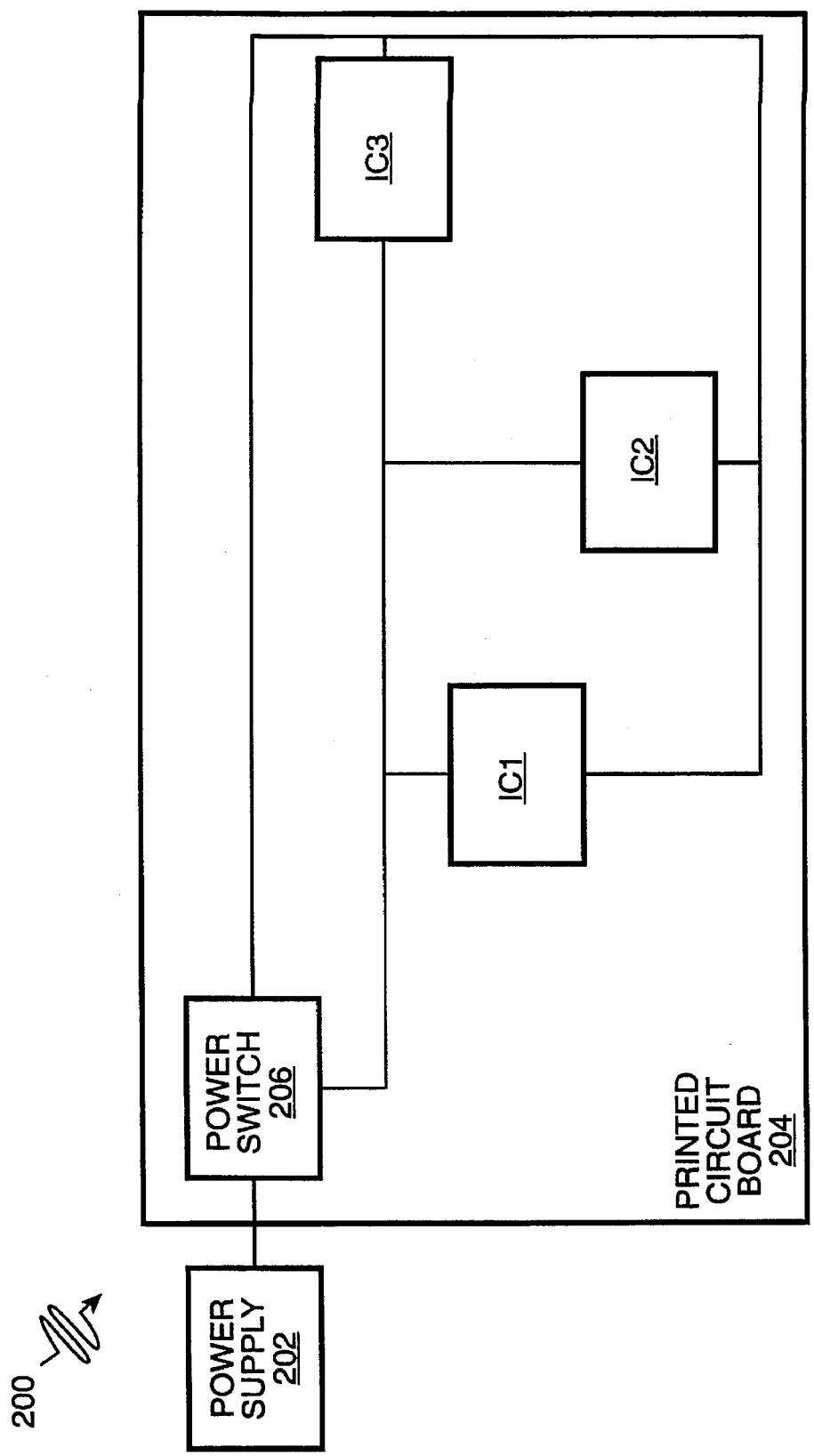
FIG. 4 is a schematic top view of a printed circuit board in accordance with the present invention.
Figure 5:
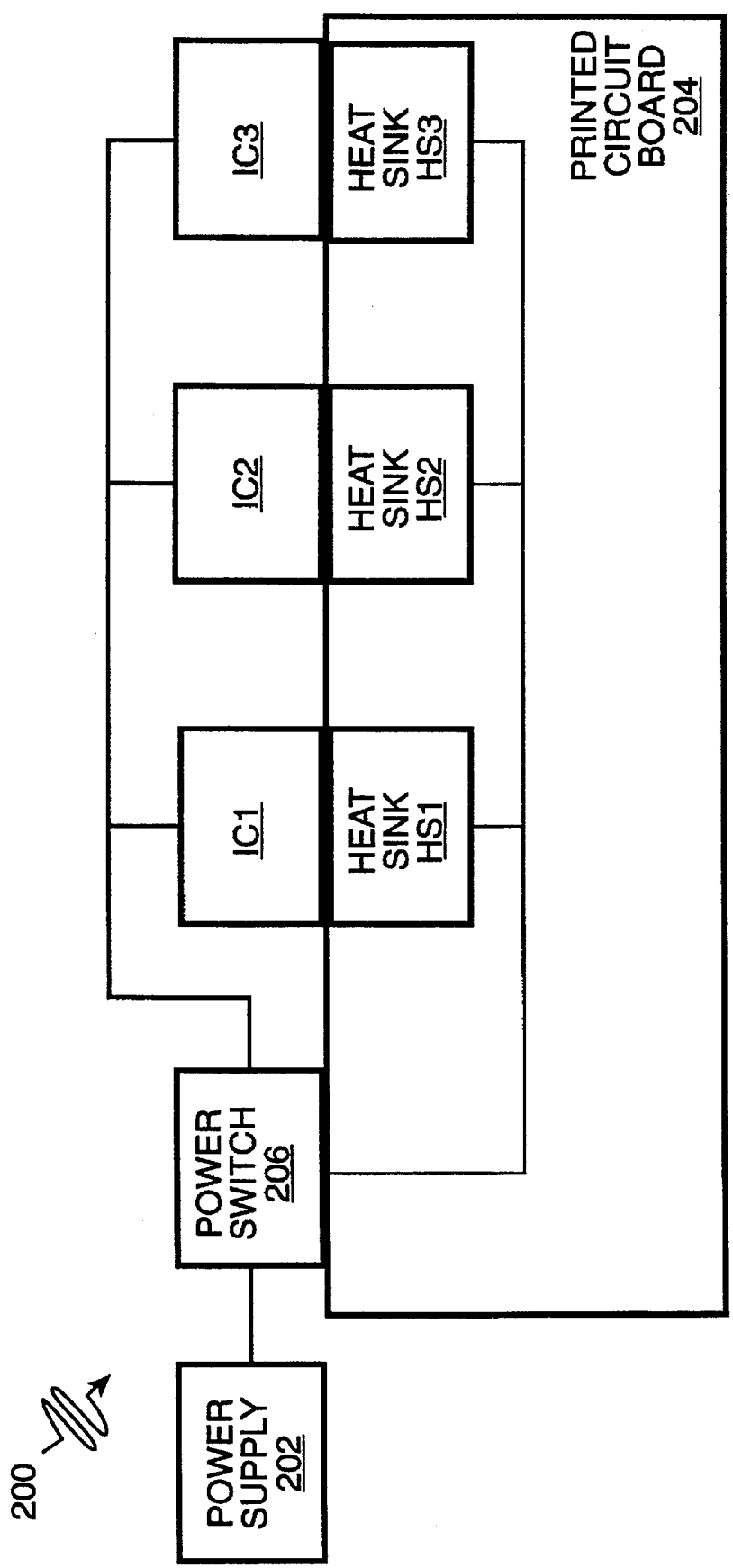
FIG. 5 is a schematic sectional view of the printed circuit board of FIG. 3.

The present invention also provides for mother-board wide operation, as illustrated with respect to an integrated circuit system 200, shown in FIGS. 4 and 5. System 200 includes a power supply 202, a printed circuit board 204, a power switch 206 mounted on printed circuit board 204, and three integrated circuits IC1, IC2 and IC3. Printed circuit board 204 includes a multitude of conductors providing for communications among integrated circuits IC1, IC2 and IC3 as well as for communications between these devices and devices off printed circuit board 204. Only those conductors directly concerning the present invention are illustrated in FIGS. 4 and 5.

As shown in FIG. 5, heat sinks HS1, HS2, and HS3 are embedded in printed circuit board 204 beneath respective high-power integrated circuits IC1, IC2, IC3. Lower power integrated circuits on printed circuit board 204 are not shown and do not have respective heat sinks. Power switch 206 controls the power delivered to integrated circuits IC1, IC2 and IC3. If any of integrated circuits heats sufficiently that the core of the adjacent heat sink melts, the resulting liquid phase is detected. The detection signal is transmitted to a control input of power switch 206, decoupling power from all active elements on printed circuit board 204. After system 200 cools down, a manual reset is used to recouple power and restore normal operation.

Selection of the core material can be made follows. In general, the maximum operating temperature for an integrated circuit is known. The lowest core temperature likely to occur when the integrated circuit reaches its maximum operating temperature is determined, either through calculation or experimentation or both. The desired melting point should be at or somewhat below this core temperature. Common temperature ranges for integrated circuits are 0° C. to 70° C., and –40° C. to 85° C.

A wide range of materials, both organic and inorganic can be used. The preferred materials are multiphase metal alloys. Fusible alloys are a class of such alloys with melting points at or below 100° C. Low-melting solders are another source of core materials. (Fusible alloys and low-temperature alloys are not mutually exclusive classes.) Common lead/tin solders have melting points of 180° C. or more; this is too high for most integrated circuits. However, adding bismuth and/ or cadmium lowers the melting point. Bismuth solders and indium solders tend to have low melting points; the preferred core is an indium/bismuth core. Many bismuth alloys have melting pints in the range 50° C.–150° C. Desirable characteristics other than melting temperature include good thermal conductivity and high heat of fusion. The following table provides the melting point and composition of selected core alloys.

| Melting Point °C. | Composition % |
| --- | --- |
| 58 | 49.5 Bi, 21.3 In, 17.6 Pb, 11.6 Sn |
| 61 | 51 In, 32.9 Bi, 16.5 Sn |
| 67 | 66 In, 34 Bi |
| 70 | 60 Bi, 27 Pb, 13 Sn |
| 92 | 50 Bi, 30 Pb, 20 Sn |
| 96 | 82 Te, 18 Cu |
| 109 | 50 Bi, 28 Pb, 22 Sn |
| 116 | 50 Sn, 50 In |
| 117 | 52 In, 48 Sn |
| 124 | 55.5 Bi, 44.5 Pb |
| 138 | 58 Bi, 42 Sn |

The present invention provides a variety of methods for detecting the phase of the core material. For some core materials, electrical properties change upon melting. For example, where resistance changes occur, these can be detected and used to trigger events. Many metals expand or contract upon melting. The volume change can be detected and used to trigger power reduction events. In the first embodiment, phase was determined by the success or non-success of an attempt to rotate an object in the core. Alternatively, translational motion of a solenoid-driven object can be monitored.

The action taken to reduce power consumption can be varied. System wide power down is simple, but drastic. A controlled power down allowing data and state information in volatile memory to be saved is better. The delay in the temperature rise due to the heat of fusion provides the time margin required for such a controlled shutdown. Continued operation at reduced performance is preferred. This can be achieved by lower clock rates, disabling optional circuits components such as math coprocessors, etc. These and other modifications to and variations upon the preferred embodiments are provided for by the present invention, the scope of which is limited only by the following claims.

What is claimed is:

1. An integrated circuit system comprising:
   an integrated circuit, said integrated circuit having a temperature range within which it can safely operate;
   a fusible material that melts from a solid phase to a liquid phase at a temperature within said temperature range;
   a heat sink body of body material that does not melt within said temperature range, said body defining a cavity containing and enclosing said fusible material, said body physically separating said fusible material from said integrated circuit, said body thermally coupling said fusible material to said integrated circuit;
   phase means for monitoring said fusible material to determine when said fusible material changes from its solid phase to its liquid phase and when said fusible material changes from its liquid phase to its solid phase; and
   power reduction means for reducing the power dissipated by said integrated circuit, said power reduction means being coupled to said phase means so that said power reduction means reduces the power dissipated by said integrated circuit in response to a determination by said phase means that said fusible material is in its liquid phase.

2. An integrated circuit system as recited in claim 1 wherein said power reduction means is also for restoring full power operation in response to a determination by said phase means that said fusible material has resumed its solid phase.

3. An integrated circuit system as recited in claim 1 wherein said power reduction means is a power switch that turns off power to said integrated circuit in response to a determination by said phase means that said material is in its liquid phase.

4. An integrated circuit system as recited in claim 1 wherein said power reduction means is a clock frequency means that reduces the clock frequency of said integrated circuit in response to a determination by said phase means that said fusible material is in its liquid phase.

5. An integrated circuit as recited in claim 1 wherein said phase means includes:
   an object within said fusible material;
   means for applying force to said object sufficient to move said object a predetermined amount through said material when said fusible material is in its liquid phase but not sufficient to move said object said predetermined amount when said fusible material is in its solid phase; and
   means for detecting whether said object has moved by said predetermined amount.

6. An integrated circuit system comprising:
   an integrated circuit, said integrated circuit having a temperature range within which it can safely operate;
   a fusible material that melts from a solid phase to a liquid phase at a temperature within said temperature range;
   a heat sink body of body material that does not melt within said temperature range, said body defining a cavity containing and enclosing said fusible material, said body physically separating said fusible material from said integrated circuit, said body thermally coupling said fusible material to said integrated circuit, wherein said heat sink cavity is dimensioned so that, upon return to its solid phase, said fusible material is restored to the position it had prior to its most recent transition to its liquid phase.

7. A method of controlling the heating of an integrated circuit having an thermal operating range, said method comprising the steps of:
   thermally coupling a fusible material to said integrated circuit by attaching to said integrated circuit a heat sink body with a cavity containing said fusible material, said fusible material having a liquid phase and a solid phase, said fusible material having a melting point within said thermal operating range, said heat sink body having a melting point above said thermal operating range;
   monitoring the phase of said fusible material so as to determine when its changes from its solid phase to its liquid phase and when it changes from its liquid phase to its solid phase;
   reducing power consumption by said integrated circuit when said phase is liquid; and
   restoring full-power operation when said material resumes its solid phase.

8. A method of controlling the heating of an integrated circuit having an thermal operating range, said method comprising the steps of:
   thermally coupling a fusible material to said integrated circuit by attaching to said integrated circuit a heat sink body with a cavity containing said fusible material, said fusible material having a liquid phase and a solid phase, said fusible material having a melting point within said thermal operating range, said heat sink body having a melting point above said thermal operating range;
   monitoring the phase of said fusible material so as to determine when its changes from its solid phase to its liquid phase and when it changes from its liquid phase to its solid phase; and
   reducing power consumption by said integrated circuit when said phase is liquid by lowering a clock frequency driving said integrated circuit.

9. A method of controlling the heating of an integrated circuit having an thermal operating range, said method comprising the steps of:
   thermally coupling a fusible material to said integrated circuit by attaching to said integrated circuit a heat sink body with a cavity containing and configining said fusible material so that when it melts and then resolidifies it resumes the form and position it had before melting, said fusible material having a liquid phase and a solid phase, said fusible material having a melting point within said thermal operating range, said heat sink body having a melting point above said thermal operating range;

monitoring the phase of said fusible material so as to determine when its changes from its solid phase to its liquid phase and when it changes from its liquid phase to its solid phase; and reducing power consumption by said integrated circuit when said phase is liquid.

* * * * *